United States Patent [19]

Quernemoen

[11] Patent Number: 4,872,554
[45] Date of Patent: Oct. 10, 1989

[54] REINFORCED CARRIER WITH EMBEDDED RIGID INSERT

[75] Inventor: Daniel R. Quernemoen, Chaska, Minn.

[73] Assignee: Fluoroware, Inc., Chaska, Minn.

[21] Appl. No.: 238,989

[22] Filed: Aug. 23, 1988

Related U.S. Application Data

[63] Continuation of Ser. No. 69,699, Jul. 2, 1987, abandoned.

[51] Int. Cl.⁴ .................. B65D 85/48; B05C 13/02; F27D 5/00
[52] U.S. Cl. .................. 206/454; 118/500; 211/41; 220/71; 432/259
[58] Field of Search .............. 206/334, 328, 453, 454, 206/449; 220/71; 118/500, 728; 211/40, 41; 432/258, 259

[56] References Cited

U.S. PATENT DOCUMENTS

| | | | |
|---|---|---|---|
| 2,676,729 | 4/1954 | Nerville, Jr. et al. | 220/71 |
| 2,840,256 | 6/1958 | Cobb, Jr. | 220/71 X |
| 3,181,223 | 5/1965 | Cummings | 432/259 |
| 3,294,271 | 12/1966 | Armbruster | 220/71 X |
| 3,348,721 | 10/1967 | Trevarrow, Jr. | 220/71 X |
| 3,918,756 | 11/1975 | Saville et al. | 118/500 X |
| 4,153,164 | 5/1979 | Hofmeister et al. | 211/41 |
| 4,184,841 | 1/1980 | Robinson et al. | 432/258 |
| 4,228,902 | 10/1980 | Schulte | 211/41 |
| 4,504,224 | 3/1985 | Hewitt | 432/258 |
| 4,566,839 | 1/1986 | Butler | 206/454 X |

OTHER PUBLICATIONS

UK Application No. 53835/76, Dec. 23, 1976, Pub. No. 1,571,306.
PCT/GB88/00072, Feb. 8, 1988, in English.
EPO 809008836.0, May 9, 1980, in English Pub. No. 0 028 266.

Primary Examiner—Bryon P. Gehman
Attorney, Agent, or Firm—Palmatier & Sjoquist

[57] ABSTRACT

A carrier for silicon wafers and the like for use in processing wafers, the carrier having side components and end components, the side components being tubular rails with wafer spacing and supporting teeth projecting therefrom, the side rails being of tubular plastic and having rigid inserts or rods embedded therein, the end components of the carrier being generally panel shaped and having rigid inserts or panels embedded therein, the inserts, in either rod form or panel form being formed of rigid material which is highly stable and resistant to the influences of high temperatures and strong chemicals to maintain its shape and structural integrity and formed of any of a number of materials such as quartz, ceramics, glass, and metals resistant to corrosion such as stainless steel.

16 Claims, 4 Drawing Sheets

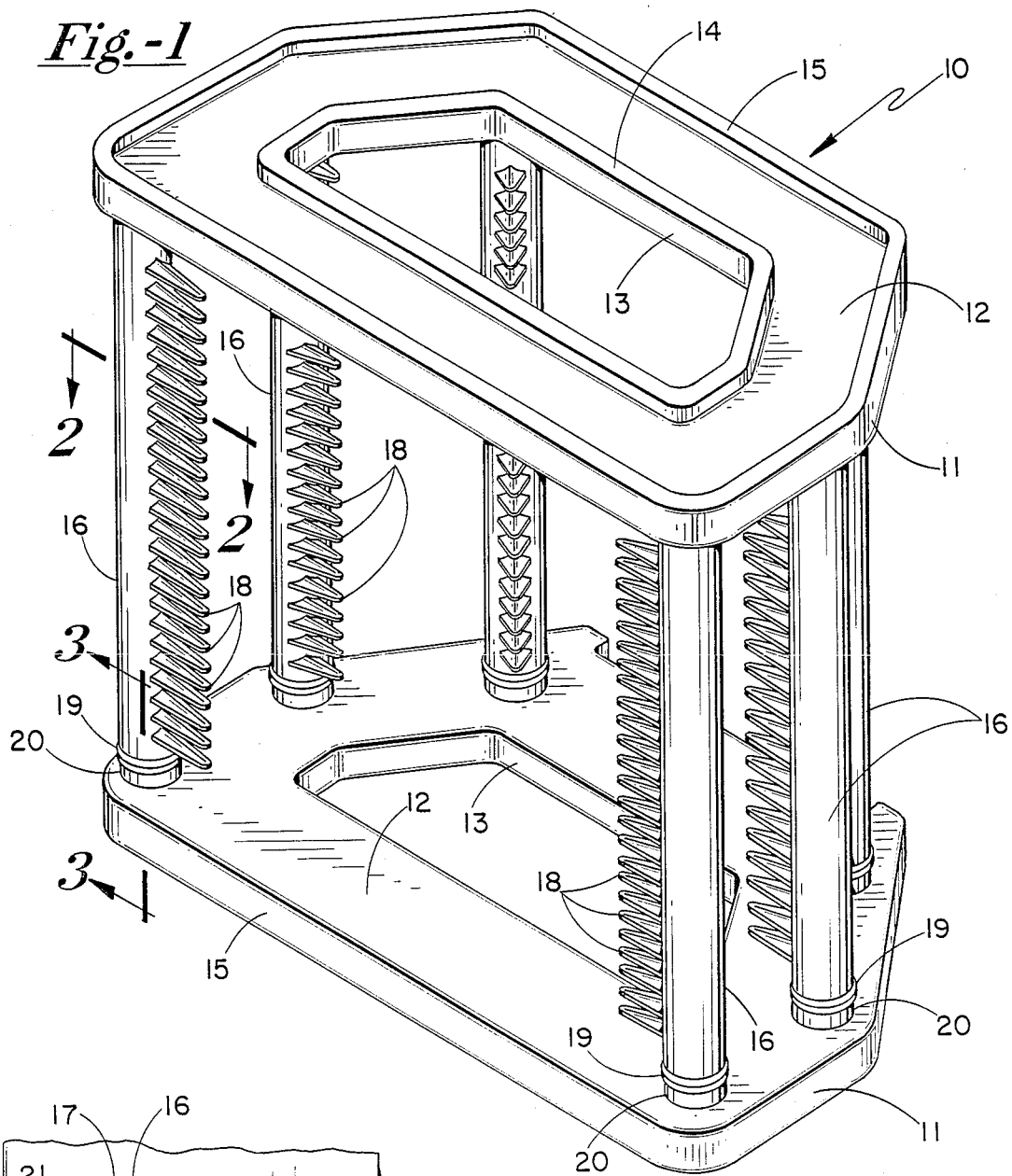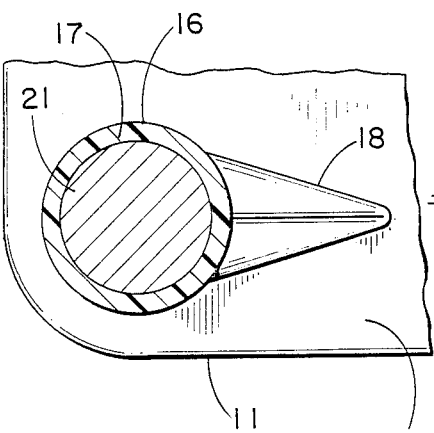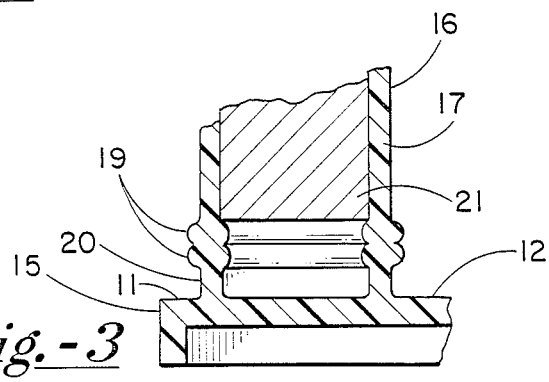

REINFORCED CARRIER WITH EMBEDDED RIGID INSERT

This is a continuation of co-pending application Ser. No. 69,699 filed on July 2, 1987, now abandoned.

This invention relates to carriers in which silicon wafers are confined for processing in the manufacture of integrated circuit chips from the wafers.

BACKGROUND OF THE INVENTION

In the processing of semiconductor wafers of silicon or other materials in the manufacture of integrated circuit chips, the wafers are confined in carriers, sometimes called cassettes, oftentimes in batches of 25. The wafers are arranged in a stack-like configuration and each wafer is in a spaced and confronting relation with adjacent wafers to accommodate spraying of liquids and gases onto the wafers and onto the faces of the wafers. The carriers have typically been molded of plastics.

The nature of the plastic material will vary, according to the particular part of the wafer processing in which the carrier is being used. For instance, for a simple storing and cleaning of the wafers, the plastic in the carriers may be polyethylene, or polypropylene or other inexpensive plastics. Many of the carriers are made of plastics which are resistant to the deteriorating effect of strong chemicals such as acids, and resistant to higher temperatures, and those plastics may include various fluorocarbon plastics such as perfluoroalkoxy (known commercially as Teflon PFA, manufactured by E.I. Dupont DeNemours & Co. of Wilmington, Del.) and others. Most of the various plastics are at least somewhat influenced by high temperatures to which they are exposed from time to time and are weakened somewhat by such higher temperatures so that the carriers may not maintain the exact shape to which they are originally formed.

Although the amount of deformation in the carriers is rather minimal in smaller sizes, as for wafers up to five and six inches in diameter, the sizes of wafers are being substantially increased to sizes of ten inches to 16 inches in diameter. Carriers of such size as to hold those large wafers may be subject to an undue deformation due to the influence of higher temperatures.

The usual working range of temperatures for Teflon PFA plastics is up to approximately 180° C. (350° F.) and the nominal melting point of Teflon PFA is approximately 302°–306° C. (575°–590° F.). Prior wafer carriers have been substantially as illustrated in U.S. Pat. Nos. 3,961,877; 4,471,716, and 4,493,418.

Certain carriers made of quartz rods for extremely high temperature use, as in baking ovens, may be somewhat as illustrated in U.S. Pat. No. 4,515,104. One other form of quartz "boat" is illustrated in U.S. Pat. No. 4,389,967.

Plastic carriers have many advantages over quartz carriers in the normal processing of silicon wafers. Plastic carriers are considerably more inexpensive, and are considerably less likely to damage the wafers being carried, among other distinct advantages.

SUMMARY OF INVENTION

An object of the invention is to produce a carrier to contain a multiplicity of silicon wafers which may have diameters of 8 inches to 16 inches or more, and which carrier is sufficiently rigid as to retain the wafers in aligned and closely spaced but continuously separated relation to each other, through the many high and low temperature processing steps through which the wafers are put in the production of circuit chips made from the wafers.

A feature of the invention is embedding in the structural components of a plastic carrier, highly rigid inserts of a material which is highly resistant to the influences of temperature in maintaining its shape. Such inserts are completely encased in the plastic which is highly stable and resistant to the influences of high temperatures and of strong chemicals as to maintain its shape and structural integrity.

More specifically the inserts may be formed of any of a number of materials, such as quartz, ceramics, glass, metals resistant to corrosion such as stainless steel, and other highly rigid materials.

The plastics are preferably moldable and melt processible, such as a melt processible fluorocarbon, and may be formed of any of a number of materials such as perfluoroalkoxy (known commercially as Teflon PFA, a trademark of E.I. Dupont DeNemours Inc. of Wilmington Del.), high density polyethylene, and other generally similar plastics.

Such carriers may vary in shape, but will usually provide supports and spacers to support and retain a multiplicity of wafers in a stack-like arrangement with individual wafers in spaced and confronting relation to each other. Certain structural components or rails will lie along the sides of the stack and traverse the edges of the wafers. The rails carry wafer supporting spacing elements which protrude between adjacent wafers. Such supporting and spacing elements are sometimes referred to as teeth and may take the form of nibs projecting between the wafers, or of elongate ribs extending between and along peripheral positions of adjacent wafers.

Other structural components of generally panel shape may form the ends of the carriers and confront the faces of the wafers in the stack-like arrangement.

The rigid inserts are or may be embedded in any or all of such structural components in the side rails. The inserts may be rod-shaped. In the end panels, the embedded inserts may be panel shaped.

Such structural components are affixed to each other, thus forming a one piece carrier.

The rigid inserts prevent or absolutely minimize flexing or deformation of the structural components of the carrier and contribute materially to maintain the carrier as a whole in its desired shape. Accordingly, the wafers are retained in the positions intended for processing.

In addition to providing stability and structural integrity in the carrier, the embedding of rigid inserts into the structural components of the carrier permits the structural components to be reduced in size as compared to comparable structural components of molded plastic only. Accordingly the components, as along the edges of the wafers, may be more widely spaced from each other, thus allowing more open space through which sprays of processing liquids and gases may be passed onto the wafers, and conversely, minimizing the width or size of the obstructions to such sprays and the accompanying shadowing effect which reduces the application of such sprays to the wafer.

BRIEF DESCRIPTION OF THE DRAWINGS

FIG. 1 is a perspective view of a wafer carrier incorporating the present invention.

FIG. 2 is an enlarged detailed section view taken at 2—2 in FIG. 1.

FIG. 3 is an enlarged detailed section view taken at 3—3 in FIG. 1.

DETAILED SPECIFICATION

Figure 4:
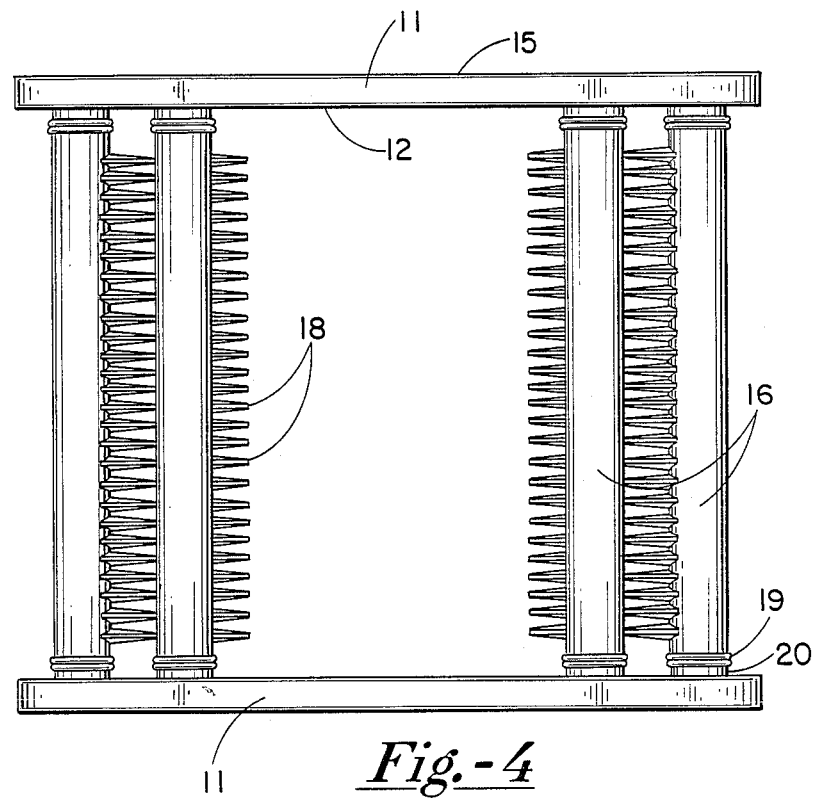
FIG. 4 is a rear elevation view of the carrier.
Figure 6:
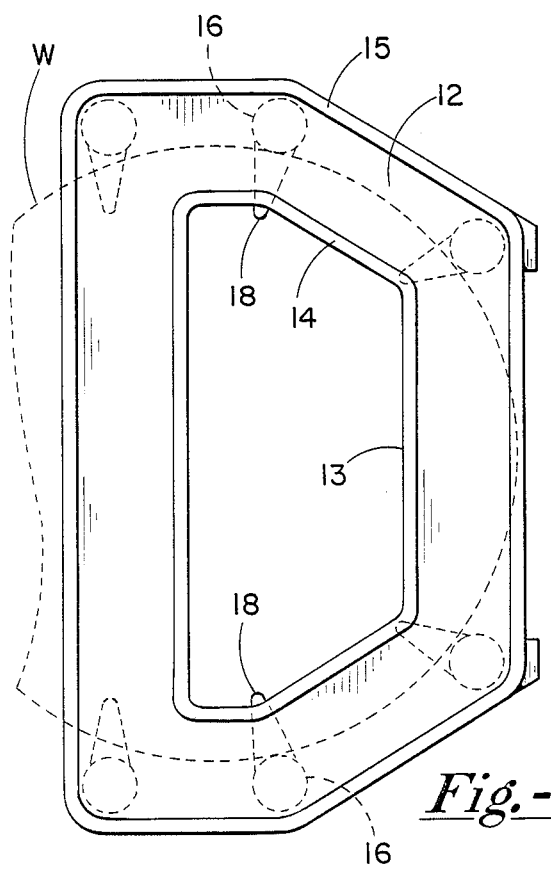
FIG. 6 is a top plan view of the carrier.

One form of the invention is illustrated in FIGS. 1-6, and the carrier is indicated in general by the numeral 10.

The carrier is illustrated in FIG. 1 as standing on end, and this is the orientation in which the carrier is most often used during processing of wafers. In this position the wafers lie horizontally, and may easily slide into and out of the carrier for use and processing.

The plastic structural end components 11 include panels 12 with openings 13 formed therein. The panels 12 have annular and inner and outer perimeter flanges 14 and 15 projecting from the panel in a direction endways outwardly, and formed integrally of the panel 12.

The side structural components 16 of the carrier 10 are formed of plastic tubular rails or ribs 17 which extend between and are in one piece with the end panels 12.

Figure 5:
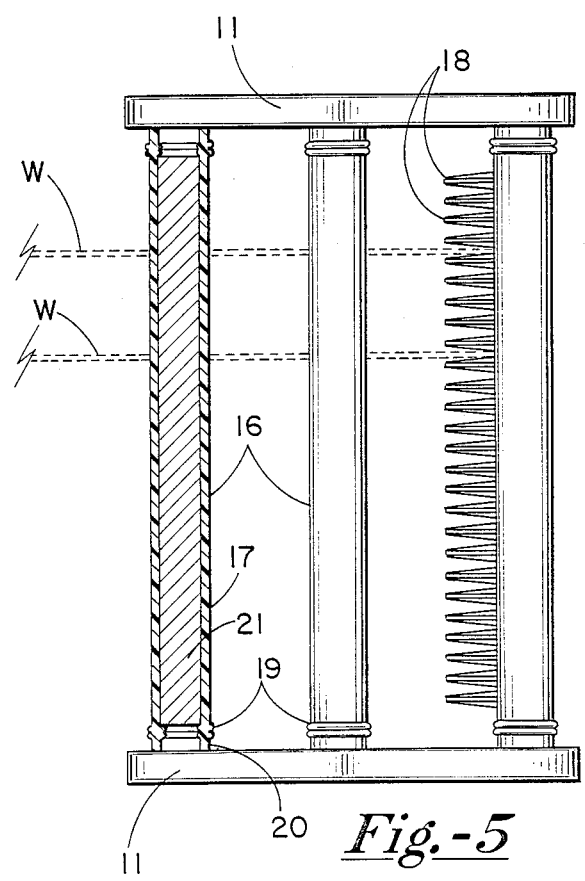
FIG. 5 is a side elevation view thereof and partly broken away for clarity of detail.

Each of the tubular rails 17 has a multiplicity of teeth or plastic projections 18 formed integrally with the tubular rail 17 and projecting inwardly of the carrier and toward the other rails on the opposite side. The teeth or spacers 18 function to support the wafers and maintain the wafers in spaced and confronting relation with each other. The wafers W will rest upon the teeth or spacers 18 in the manner illustrated in FIG. 5 where the wafers W are illustrated in phantom line. Adjacent teeth of the tubular rails are spaced the width of a wafer W, as shown in FIG. 5.

As illustrated in FIGS. 1 and 3, the ends of the rails have annular beads 19 formed thereon and resulting from a weld produced between the tubular rail 17 and the tubular stubs or bosses 20 formed integrally of the panel 12 and joined by fusion or welding to the rails 17. After welding between the stub 20 and rail 17 have been completed as is evidenced by the beads 19, the stub end becomes a part of the rail as well, being integral and in one piece therewith.

The rails or structural components 16 are arranged to confine wafers placed in the carrier so the wafers have support from multiple locations of the several rails or side components of the carrier. The wafers W may be loaded into and removed from the carrier simply by sliding them in and out of the spaces between the teeth.

The tubular rails 17 embrace and confine rigid inserts 21 which are of a material that is highly resistant to the influences of high temperatures in maintaining its rigidity and shape. Inserts 21 are rod shaped and as illustrated in FIGS. 1-6, are confined in the side structural components or rails 17. The inserts are formed, in their preferred form of quartz, but may be also formed of any of a number of materials such as ceramics, glass, metals resistant to corrosion such as stainless steel and other highly rigid materials. The tubular rails 17 embrace and fit tightly onto the insert rods 21 so that the rods are held securely in place without moving around inside the rails. Although the ends of the rods are shown in FIG. 3 to be spaced from the panel 12 of the end structural component 11, the ends of the insert rods may bear against the panels 12 in the event other forms of construction are utilized, such as molding the tubular rails 17 integrally with the end panels 12. The rigid inserts or rods 21 stiffen the rails 17 to prevent flexing of them and to maintain a stable relationship with respect to the end panels 12 and with the wafers carried in the carrier.

Although the welds at the ends of the rails 17 as evidenced by the weld beads 19, indicate that the tubular rails 17 are molded separately from the end panels 12, the tubular rails 17 may be simultaneously molded integrally of the end components 11 and embracing insert rods which may extend entirely to the end panels 12.

In the form illustrated in FIGS. 7-11, a similar carrier 10.1 is illustrated and has, at one end of the carrier, a structural end component 22 with an annular shape substantially identical to the end component 11 of FIG. 1. The end component 22 defines a panel 23 which has a hollow interior or chamber 24 confining a rigid insert 25 identical in shape and annular to follow the annular interior opening 24 around the entire periphery of the panel 23.

The other structural end component 26 defines a generally H-shaped panel 27 having an interconnecting flange portion 28 and an outwardly projecting crossbar 29. The structural end of component 26 also has annular and endways outwardly projecting flanges 30 formed integrally of the panel 27 and of the crossbar 29, and providing flat surfaces so that the carrier may be stood on its end while wafers are being loaded and unloaded into and from the carrier.

The panel 27 of the end component 26 has a panel shaped rigid insert 31 embedded therein. The rigid insert 31 is also panel shaped and has the same general configuration as the panel 27 of the end component 26, but the panel 27 completely encases the rigid insert 31 within the chamber or space 32 of the panel 27 in which the insert is confined.

Figure 7:
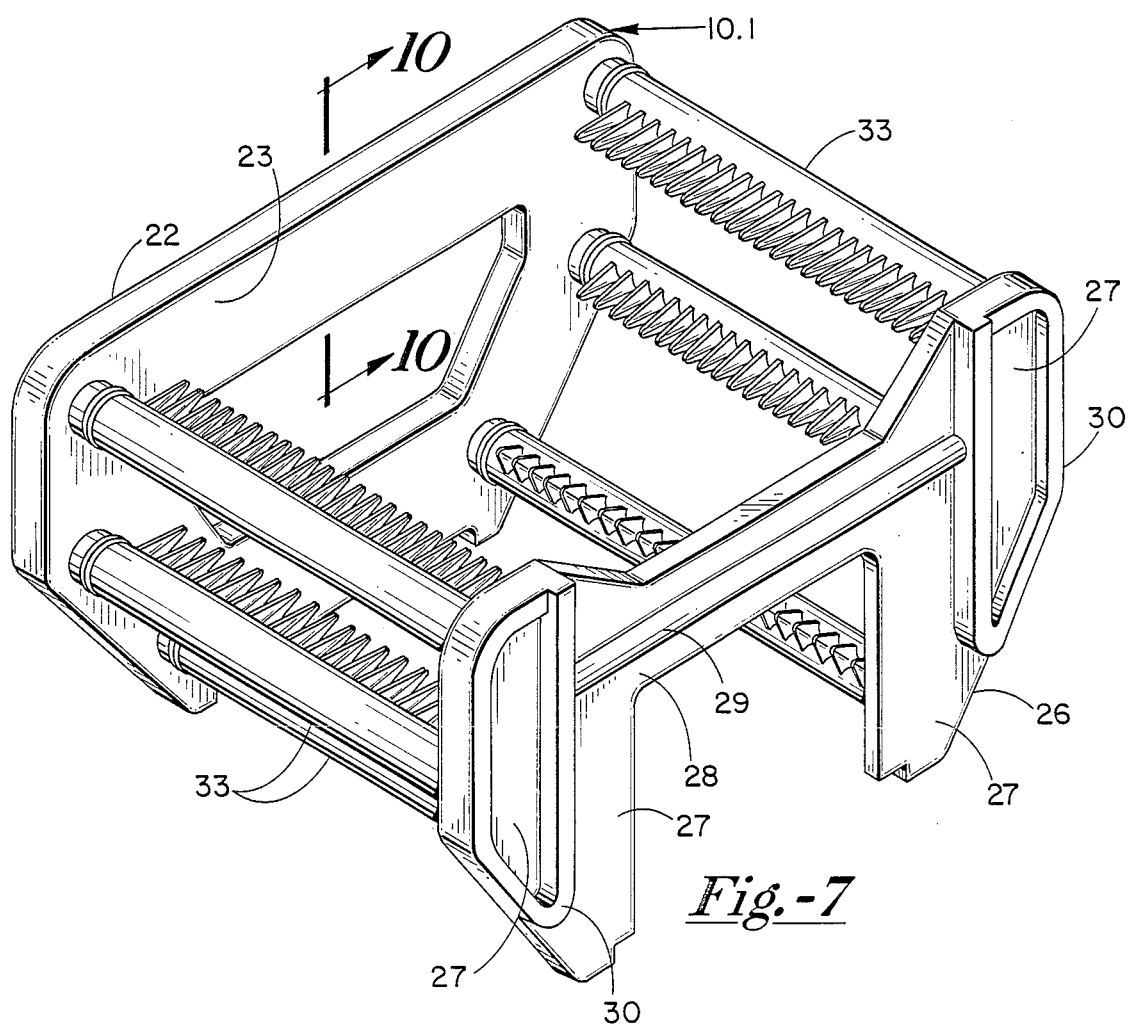
FIG. 7 is a perspective view of a modified form of carrier incorporating the present invention.
Figure 8:
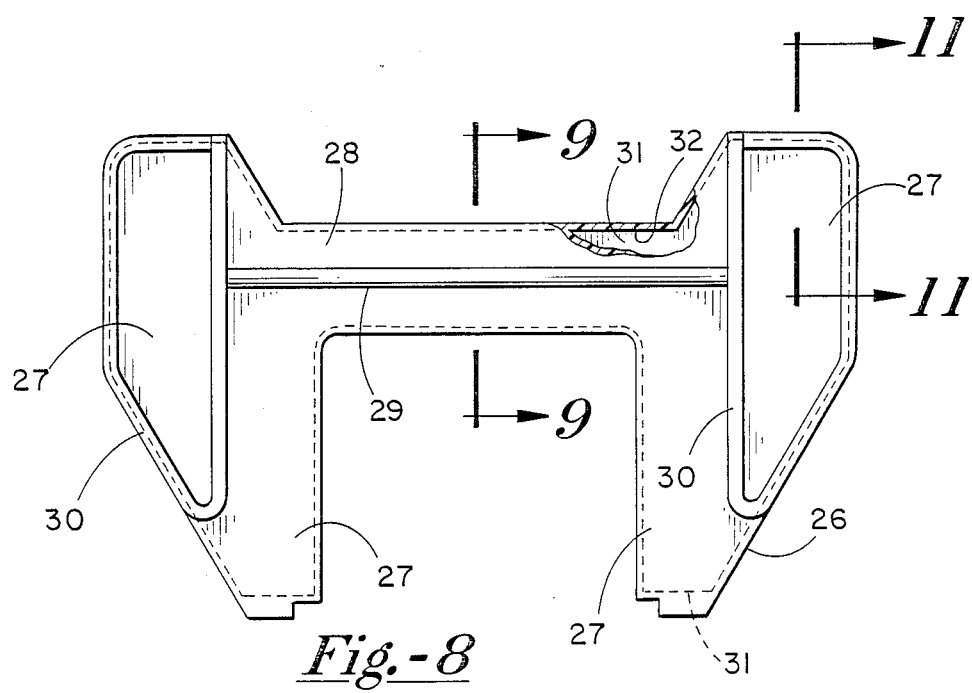
FIG. 8 is an end elevation of the view of FIG. 7.
Figure 9:
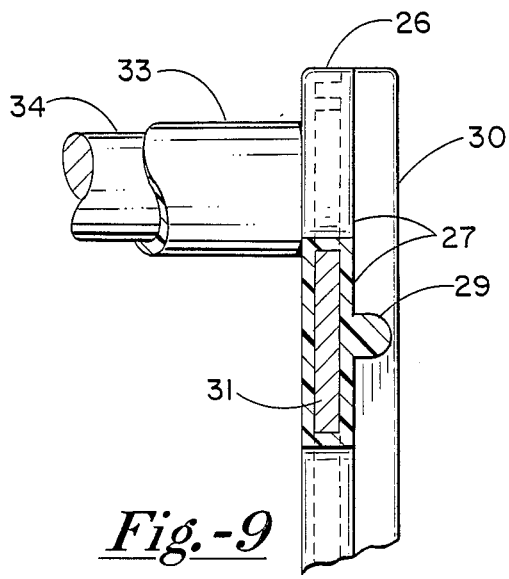
FIG. 9 is an enlarged detailed section view taken approximately at 9—9 of FIG. 7.
Figure 10:
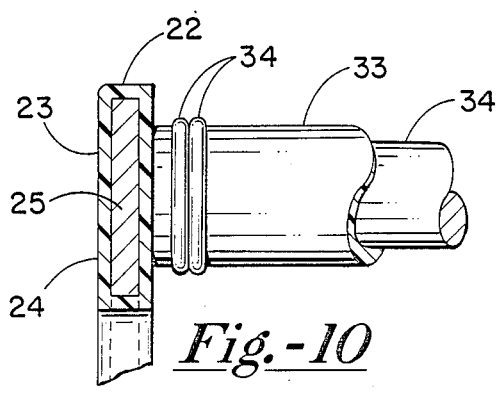
FIG. 10 is an enlarged detailed section view taken approximately at 10—10 of FIG. 7.
Figure 11:
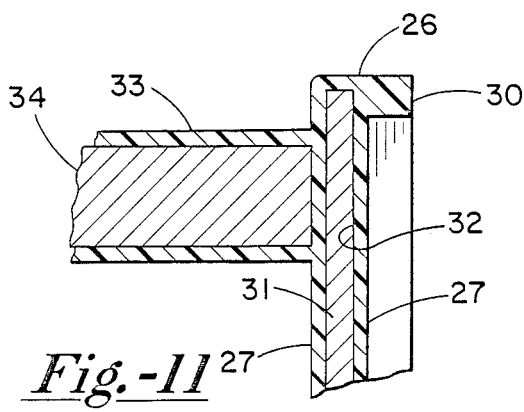
FIG. 11 is an enlarged detailed section view taken approximately at 11—11 of FIG. 7.

FIG. 11 illustrates that the tubular plastic rails 33 of the carrier 10.1 are molded integrally with the panel 27 of the end component 26. In FIGS. 7 and 10, the opposite end of the tubular rails 33 are illustrated to be connected to the panel 23 by a welded joint evidenced by the weld beads 34 formed in the welding process. The side components or rails 33 of the carrier 10.1 also have rigid inserts 34 embedded therein and the tubular rail tightly embraces the rigid insert or rod 34. It will be seen in FIG. 11, that the end of the insert or rod 34 bears directly against the panel 27 at the end of the tubular rail 33.

It is important to note that the tubular plastic side rails of the carriers may be attached to the end components in any of a number of ways, i.e., the side rails may be attached as by welding to the end components of the carrier, or the side rails 33 may be molded integrally with the end components of the carrier, and with the rigid inserts 31 and 34 already in place during the molding.

Figure 12:
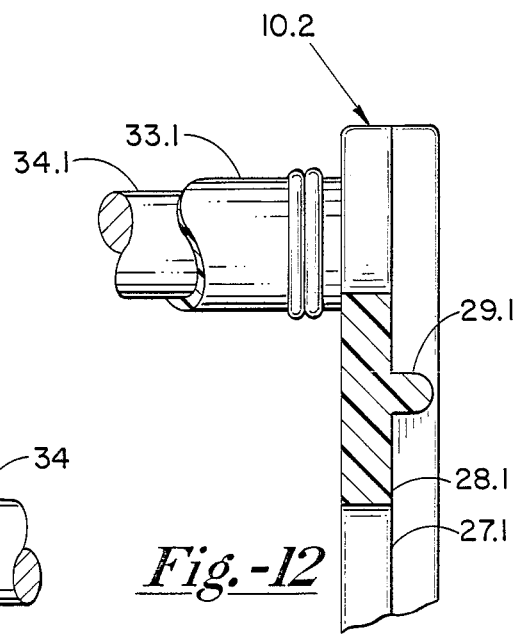
FIG. 12 is a detailed section view similar to FIG. 9, but showing another alternative form of the invention.

FIG. 12 illustrates another modified form of the invention wherein the end panel 27.1 of the carrier, and the flanges 28.1 are a solid plastic and do not have the rigid insert embedded therein. The panel 27.1 will have a shape similar to that illustrated in FIGS. 7 and 8, and the flanges 28.1 and the crossbar 29.1 have the same relationship as do the corresponding parts of 27, 28 and 29 in FIGS. 7 and 8. In the carrier 10.2 of FIG. 12, the side rail 33.1 is tubular and plastic and has the rigid insert 34.1 embedded therein.

Figure 13:
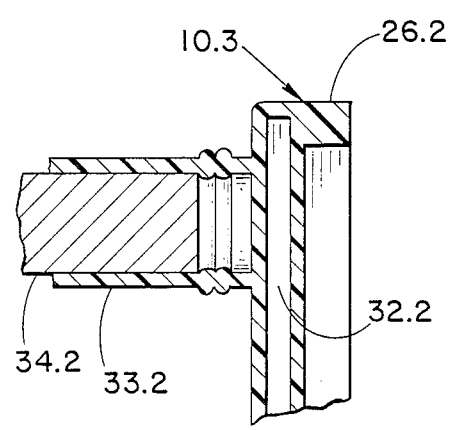
FIG. 13 is a detailed section, similar to FIG. 11 and showing an alternative form of the invention.

In the form illustrated in FIG. 13, it may be desirable to form the end component 26.2 with a hollow center or chamber 32.2 to provide for optional insertion of a rigid insert panel as illustrated in FIG. 11. Again, in the carrier 10.3 of FIG. 13, the side rail 33.2 has a rigid insert or rod 34.2 embedded therein.

The various inserts 21 of FIGS. 1-6, and insert 34 and 31 of FIGS. 7-11 and the comparable inserts 34.1 and 34.2 of FIGS. 12 and 13 are all formed of any of a number of materials such as quartz, ceramics, glass, metals resistant to corrosion such as stainless steel and other highly rigid materials. The tubular side rails may be molded separately from the end components of the carrier, and the inserts may be inserted into the side rails prior to assembling and welding of the tubular side rails to the end panel; or the rigid inserts or rods may be inserted into the molding equipment prior to the injection of the plastic as to mold the plastic around the inserts, whether the inserts be rod shaped or panel shaped as illustrated in FIGS. 2, 3, and 8-10.

With a carrier formed with rigid inserts, either in the side rails alone, or in the end panel alone, or in both the side rails and end components, the strength of the carrier will be substantially improved, especially at the higher temperatures wherein the plastic may be somewhat weakened under influence of the higher temperatures.

What is claimed:

1. A rigid carrier for retaining a multiplicity of thin wafers in closely spaced but continuously separated confronting relation to each other and in a stack-like arrangement to accommodate liquid and gaseous spray processing and the many high and low temperature processing steps of the wafers in the production of circuit chips from the wafers, comprising
   a plurality of plastic structural components adjacent each other and affixed together and arranged to define an integral one-piece rigid container to embrace and confine the wafers, said structural components being widely spaced from each other to permit more open space for access by liquid and gaseous sprays to the wafers confined, certain of said structural components having a multiplicity of teeth formed integrally therewith and projecting inwardly of the certain components to support and space the wafers, adjacent teeth of a said structural component being spaced the width of one of said wafers,
   and a rigid insert completely embedded in one of said structural components and stiffening the component, said insert being formed of a material which is highly resistant to the influences of temperature in maintaining its shape and rigidity to minimize flexing or deformation of the structural components and the carrier.

2. A carrier for a multiplicity of thin wafers according to claim 1, wherein said structural components include end components and elongate side components affixed to each other, the side components traversing the edges of the wafers in the stack-like arrangement, and the end components confronting the faces of the wafers, said insert being embedded in one of the side components.

3. A carrier for a multiplicity of thin wafers according to claim 2, and an insert also being embedded in one of the end components.

4. A carrier for a multiplicity of thin wafers according to claim 2, wherein the elongate plastic side components are substantially tubular, the rigid insert being rod-like and being confined within one of the tubular plastic side components.

5. A carrier for a multiplicity of thin wafers according to claim 2, and a plurality of side components and inserts wherein one of the inserts being embedded in each of the side components.

6. A carrier for a multiplicity of thin wafers according to claim 1, wherein said structural components include end components and elongate side components affixed to each other, the side components traversing the edges of the wafers in the stack-like arrangement, and the end components confronting the faces of the wafers, said insert being embedded in one of the end components.

7. A carrier for a multiplicity of thin wafers according to claim 6, and at least two end components and a plurality of said inserts wherein one of the inserts being embedded in each of the end components.

8. A carrier for a multiplicity of thin wafers according to claim 6, wherein one of the plastic end components is generally panel shaped and includes an interior chamber, the rigid insert being in said chamber and in close fitting relation with the plastic end component.

9. A carrier for a multiplicity of thin wafers according to claim 1, wherein said structural components include end components and elongate side components affixed to each other, one of end components incorporating a plastic molded panel, the side components including elongate rails affixed to the plastic molded panel.

10. A carrier for a multiplicity of thin wafers according to claim 9, and one of said rails having a rigid rod-shaped insert embedded therein, the insert rod having one end confronting said plastic molded panel.

11. A carrier for a multiplicity of thin wafers according to claim 10, wherein the end of said rod shaped insert being in a spaced relation with the plastic molded panel.

12. A carrier for a multiplicity of thin wafers according to claim 10, wherein the end of the rod shaped insert bearing against the plastic molded panel.

13. A carrier for a multiplicity of thin wafers according to claim 9, wherein said plastic molded panel of the end component of the carrier having a panel shaped rigid insert embedded and completely encased in said plastic molded panel.

14. A carrier for a multiplicity of thin wafers according to claim 1, wherein said insert is formed of a material selected from a group of materials including quartz, ceramics, glass, and metals resistant to corrosion including stainless steel.

15. A rigid carrier for retaining a multiplicity of thin wafers in closely spaced but continuously separated confronting relation to each other and in a stack-like arrangement to accommodate liquid and gaseous spray processing and the many high and low temperature processing steps of the wafers in the production of circuit chips from the wafers, comprising

- a plurality of plastic structural components adjacent each other and affixed together and arranged to define an integral one-piece rigid container to embrace and confine the wafers, said structural components being widely spaced from each other to permit more open space for access by liquid and gaseous sprays to the wafers confined, wherein said structural components include end components and elongate side components affixed to each other, the side components traversing the edges of the wafers in the stack-like arrangement, said side components having a multiplicity of teeth formed integrally therewith and projecting inwardly of the side components to support and space the wafers, adjacent teeth of a said side component being spaced the width of one of said wafers, and the end components confronting the faces of the wafers,
- and a rigid insert completely embedded in one of said structural components and stiffening the component, said insert being formed of a material which is highly resistant to the influences of temperature in maintaining its shape and rigidity to minimize flexing or deformation of the structural components and the carrier.

16. A rigid carrier for retaining a multiplicity of thin wafers in closely spaced but continuously separated confronting relation to each other and in a stack-like arrangement to accommodate liquid and gaseous spray processing and the many high and low temperature processing steps of the wafers in the production of circuit chips from the wafers, comprising

- a plurality of plastic structural components adjacent each other and affixed together and arranged to define an integral one-piece rigid container to embrace and confine the wafers, said structural components being widely spaced from each other to permit more open space for access by liquid and gaseous sprays to the wafers confined, wherein said structural components include end components and elongate side components affixed to each other, the side components traversing the edges of the wafers in the stack-like arrangement, said side components each being substantially tubular and having a multiplicity of teeth formed integrally therewith projecting inwardly of the side components to support and space the wafers, adjacent teeth of a said side component being spaced the width of one of said wafers, and the end components each being generally panel shaped and including an interior chamber and the end components confronting the faces of the wafers and being affixed to the side components,
- and a rigid insert completely embedded in one of said structural components and stiffening the component, said insert being formed of a material which is highly resistant to the influences of temperature in maintaining its shape and rigidity to minimize flexing or deformation of the structural components and the carrier.

* * * * *